United States Patent [19]

Suzuki et al.

[11] Patent Number: 5,751,041
[45] Date of Patent: May 12, 1998

[54] SEMICONDUCTOR INTEGRATED CIRCUIT DEVICE

[75] Inventors: Megumi Suzuki; Akiyoshi Asai; Jun Sakakibara, all of Kariya, Japan

[73] Assignee: Denso Corporataion, Kariya, Japan

[21] Appl. No.: 732,995

[22] Filed: Oct. 16, 1996

[30] Foreign Application Priority Data

Oct. 23, 1995 [JP] Japan .................. 7-274433

[51] Int. Cl.$^6$ .................. H01L 27/01; H01L 23/62
[52] U.S. Cl. .................. 257/357; 257/352; 257/355; 257/356; 257/359; 257/360
[58] Field of Search .................. 257/352, 355, 257/356, 360, 363, 357, 359

[56] References Cited

U.S. PATENT DOCUMENTS

| | | | |
|---|---|---|---|
| 5,477,407 | 12/1995 | Kobayashi et al. | 361/56 |
| 5,528,064 | 6/1996 | Thiel et al. | 257/362 |
| 5,545,909 | 8/1996 | Williams et al. | 257/355 |
| 5,567,968 | 10/1996 | Tsuruta et al. | 257/356 |
| 5,610,426 | 3/1997 | Asai et al. | 257/360 |

FOREIGN PATENT DOCUMENTS

| | | |
|---|---|---|
| 1-278778 | 11/1989 | Japan . |
| 4-155957 | 5/1992 | Japan .................. 257/355 |
| 4-345064 | 12/1992 | Japan . |

*Primary Examiner*—Valencia Martin Wallace
*Attorney, Agent, or Firm*—Cushman Darby & Cushman IP Group of Pillsbury Madison & Sutro LLP

[57] ABSTRACT

In a semiconductor integrated circuit device having an input protection circuit element such as a diode formed in the semiconductor substrate, the leak current is suppressed. An nMOS transistor and a pMOS transistor that constitute a CMOS inverter circuit are formed using a SOI structure. An n-type diffusion layer and p-type diffusion layer are formed within the semiconductor substrate to thereby construct a protective diode that forms an input protection circuit for the CMOS inverter circuit. By surrounding the outer periphery of the n-type diffusion layer with the p-type diffusion layer, the depletion layer that is formed at an interface between the semiconductor substrate and a buried insulation film therein is cut off by the p-type diffusion layer, thereby suppressing the leak current between the n-type diffusion layer and the p-type diffusion layer.

24 Claims, 9 Drawing Sheets

5,751,041

1

SEMICONDUCTOR INTEGRATED CIRCUIT DEVICE

CROSS-REFERENCE TO RELATED APPLICATION

The present application is related to and claims priority from Japanese Patent Application No. Hei 7-274433, incorporated herein by reference.

BACKGROUND OF THE INVENTION

1. Field of the Invention

The present invention relates to a semiconductor integrated circuit device having a silicon-on-insulator (SOI) structure.

2. Description of Related Art

Conventionally, in a semiconductor integrated circuit device where a semiconductor element is formed in a silicon layer (i.e., an SOI layer) disposed on a semiconductor substrate through an insulating film, a protective circuit element for protecting the semiconductor integrated circuit has been formed on the semiconductor substrate (see, e.g., Japanese Patent Application Laid-Open Publication No. hei 4-345064).

The structure of a typical such semiconductor integrated circuit device is shown in FIG. 16. A CMOS inverter 13 that is composed of an n-channel MOSFET (hereinafter referred to as "an nMOS") 9a and a p-channel MOSFET (hereinafter referred to as "a pMOS") 9b is used as an input circuit. An input protection circuit 15 is provided between the CMOS inverter circuit 13 and a bonding pad 14 that serves as a connection terminal that is to be connected to the outside. The input protection circuit 15 is composed of a protective resistor 16 that is connected in series between the bonding pad 14 and the CMOS inverter circuit 13 and a protective diode 17 that is connected in series between the bonding pad 14 and a ground line Vss.

FIG. 17 shows a cross-sectional structure of main components of the device shown in FIG. 16. In a region outside the one where the CMOS inverter circuit 13 is formed, the protective diode 17 is formed within the semiconductor substrate 1. The protective diode 17 is composed of an n-type diffusion layer 18 and p-type diffusion layer 19 that have been formed in the semiconductor substrate 1 which consists of a p-type monocrystalline silicon layer, a gate insulation film 2c and a gate electrode 3c.

In such a structure, when an SOI substrate is used that has been formed using, e.g., a SIMOX technique, since the source and drain regions of each of the nMOS 9a and pMOS 9b are formed from the same monocrystalline silicon as that from which the semiconductor substrate 1 is formed, it is impossible to make the impurity concentration very high. Accordingly, the impurity concentration of the semiconductor substrate 1 is low, and a depletion layer 23 may be formed over the entire underside of a buried insulating film 2.

For this reason, when a reverse bias voltage is applied to the protective diode 17, the area of the depletion layer 23 becomes large, and the leakage current increases. This increase in the leakage current means that a signal from the outside detrimentally leaks to the ground terminal through the protective diode 17, thereby making it possible that a normal signal is not transmitted to the internal circuit, that the current consumption in the semiconductor integrated circuit device increases, and other undesirable effects.

SUMMARY OF THE INVENTION

The present invention has been made in view of the above-mentioned problems of the prior art, and an object of the invention is to suppress the above-mentioned leakage current.

2

The above object is achieved according to a first aspect of the present invention by providing a semiconductor integrated circuit device which has a first semiconductor circuit element on an SOI layer and in which the outer periphery of a first diffusion layer of a second semiconductor circuit element is surrounded on a planar basis by a second diffusion layer whose impurity concentration is higher than that of the semiconductor substrate, and whose conductivity type is the same as that of the semiconductor substrate.

Accordingly, the depletion layer that is formed at an interface between the semiconductor substrate and an insulator layer is cut off by the second diffusion layer on a planar basis, to thereby make it possible to suppress the leakage current between the first diffusion layer and the second diffusion layer.

The above object is achieved according to a second aspect of the present invention by providing a semiconductor integrated circuit device which has a first semiconductor circuit element on an SOI layer and in which the outer periphery of a drain region of a MOSFET serving as a second semiconductor circuit element is surrounded on a planar basis by a source region.

Accordingly, the depletion layer that is formed at an interface between the semiconductor substrate and an insulator layer is cut off by the source region on a planar basis, to thereby make it possible to suppress the leakage current.

The above object is achieved according to a third aspect of the present invention by providing a semiconductor integrated circuit device which has a first semiconductor circuit element on an SOI layer and in which a second conductivity type first diffusion layer of a second semiconductor circuit element is formed within a first conductivity type second diffusion layer region that has been formed within the semiconductor substrate.

Accordingly, by forming the second diffusion layer, it is possible to prevent a depletion layer from being formed at an interface between the semiconductor substrate and the insulator layer to thereby suppress the leakage current.

Other objects and features of the invention will appear in the course of the description thereof, which follows.

BRIEF DESCRIPTION OF THE DRAWINGS

Additional objects and advantages of the present invention will be more readily apparent from the following detailed description of preferred embodiments thereof when taken together with the accompanying drawings in which.

DETAILED DESCRIPTION OF THE PRESENTLY PREFERRED EXEMPLARY EMBODIMENTS

A preferred embodiment of the present invention will be described hereinafter with reference to the drawings.

FIRST EMBODIMENT

Figure 1A:
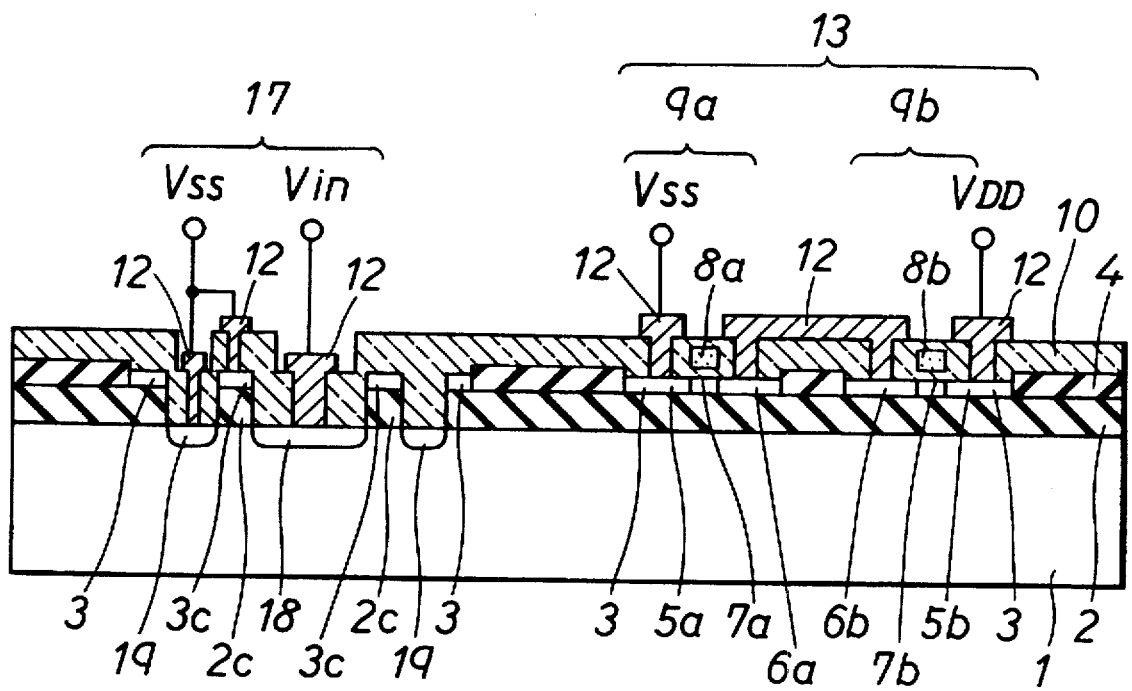
FIG. 1A is a cross-sectional view of a semiconductor integrated circuit device according to a first preferred embodiment of the present invention
Figures 1B, 1C:
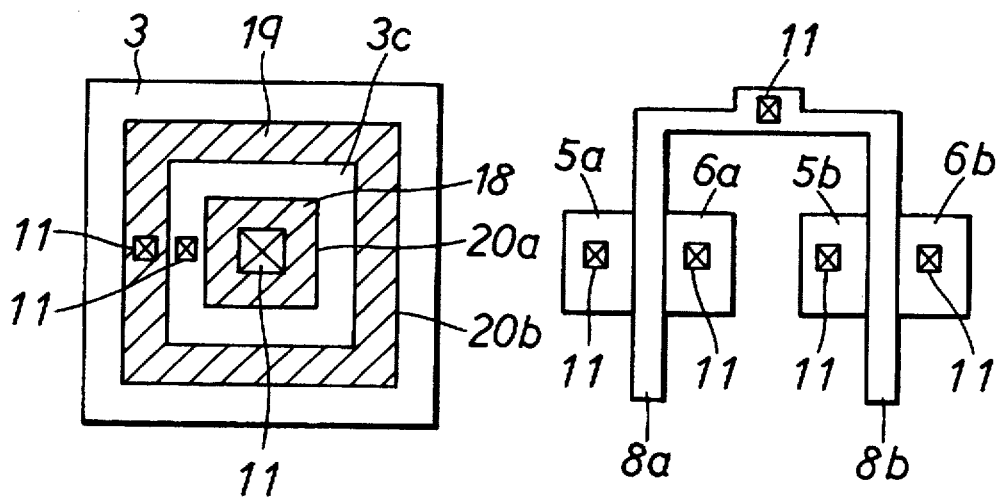
FIG. 1B is a plan view showing the semiconductor integrated circuit device of the first embodiment with its electrode portion excluded.
FIG. 1C is a plan view of the electrode.
Figure 16:
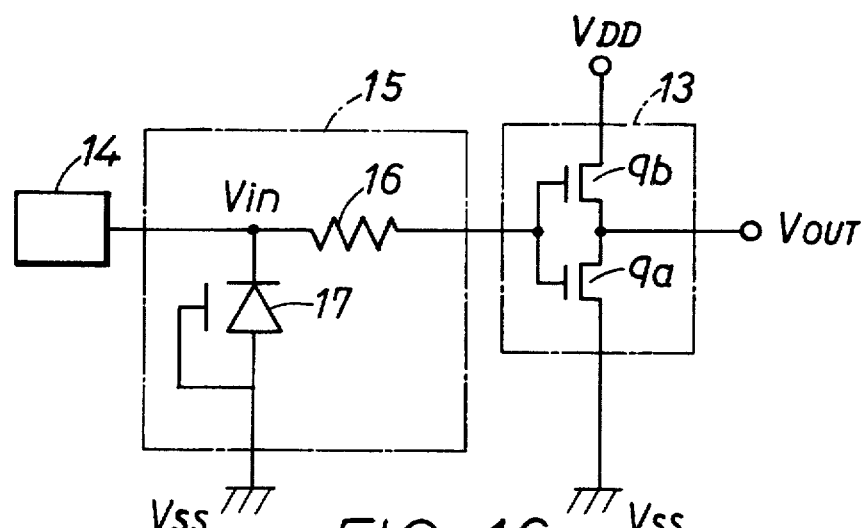
FIG. 16 is a cross-sectional view showing a conventional semiconductor integrated circuit device.

FIG. 1A is a cross-sectional view showing a semiconductor integrated circuit device according to a first embodiment of the present invention. FIG. 1B is a plan view of the device with an electrode portion thereof excluded from the Figure and FIG. 1C is a plan view of the electrode. Also, the circuit construction of the semiconductor integrated circuit device according to this first embodiment is the same as that of the device shown in FIG. 16. It is to be noted that in the plan view of FIG. 1B and the plan views that are hereafter referred to, the diffusion layer portions in semiconductor substrate 1 are hatched.

The semiconductor substrate 1 is a p-type silicon monocrystalline layer that has a first conductivity type and a buried insulating film 2 that consists of, for example, $SiO_2$ deposited using a SIMOX technique is formed thereon. A monocrystalline silicon layer (hereinafter referred to as "an SOI layer") 3 is formed thereon and is isolated in the form of islanded portions. An element separation insulating film 4 that consists of, for example, $SiO_2$ is formed around each SOI layer 3.

In a formation region of nMOS 9a, a source region 5a and drain region 6a are formed with respect to the SOI layer 3. The nMOS 9a is constituted by a gate insulation film 7a and a polysilicon gate electrode 8a.

Similarly, in a formation region of pMOS 9b, a source region 5b and drain region 6b are formed with respect to the SOI layer 3. The pMOS 9b is constituted by a gate insulation film 7b and a polysilicon gate electrode 8b.

An inter-layer insulating film 10 is formed over the SOI layer 3 and element separation insulating film 4. Wirings 12 each consisting of, for example, an Al alloy, are connected to the source regions 5a, 5b and drain regions 6a, 6b through contact holes 11 that have been formed in this inter-layer insulating film 10. Other wirings are also connected to the gate electrodes 8a and 8b; however, they have not been shown for simplicity and clarity.

Through respective ones of the wirings 12, the source region 5a of the nMOS 9a is connected to a ground line Vss, the source region 5b of the pMOS 9b is connected to a power source line VDD and the drain regions 6a, 6b of the nMOS 9a and pMOS 9b are connected to an output line Vout (not shown). A CMOS inverter circuit 13 is constructed using the nMOS 9a and pMOS 9b.

As shown in FIG. 1, a protective diode 17 is composed of a second conductivity type n-type diffusion layer 18 that is formed in the semiconductor substrate 1, a first conductivity type p-type diffusion layer 19, gate insulation films 2c and gate electrodes 3c, whereby a diode is composed of a pn junction that is formed by the n-type diffusion layer 18 and the semiconductor substrate 1. The gate insulation film 2c is part of the buried insulating film 2 and the gate electrode 3c is part of the SOI layer 3.

As shown in FIG. 1B, the periphery of the n-type diffusion layer 18 is surrounded by the first conductivity type p-type diffusion layer 19 that has the same conductivity type as that of the semiconductor substrate 1. That is, the n-type diffusion layer 18 is surrounded on a planar basis by the p-type diffusion layer 19 which is connected to the ground line Vss in order to fix the potential of the semiconductor substrate 1.

The n-type diffusion layer 18 and p-type diffusion layer 19 are formed through windows 20a and 20b that are formed in the gate insulation films 2c and gate electrodes 3c. The wirings 12 are connected to the n-type diffusion layer 18 and p-type diffusion layer 19 through contact holes 11 that have been formed in the inter-layer insulating film 10. Also, the wiring 12 is connected to the gate electrode 3c through the contact hole 11 that has been formed in the inter-layer insulating film 10. In this case, as with the diode, the gate electrode 3c need not always be formed.

Incidentally, arsenic having a concentration of, for example, $1\times10^{17}$ to $1\times10^{23}$ cm$^{-3}$ is introduced into the n-type diffusion layer 18 as an n-type impurity while, on the other hand, boron having a concentration of, for example, $1\times10^{14}$ to $1\times10^{17}$ cm$^{-3}$ is introduced into the semiconductor substrate 1 as a p-type impurity. In addition, boron, for example, is introduced into the p-type diffusion layer 19 as a p-type impurity at a concentration of $1\times10^{18}$ to $1\times10^{23}$ cm$^{-3}$.

Figure 17:
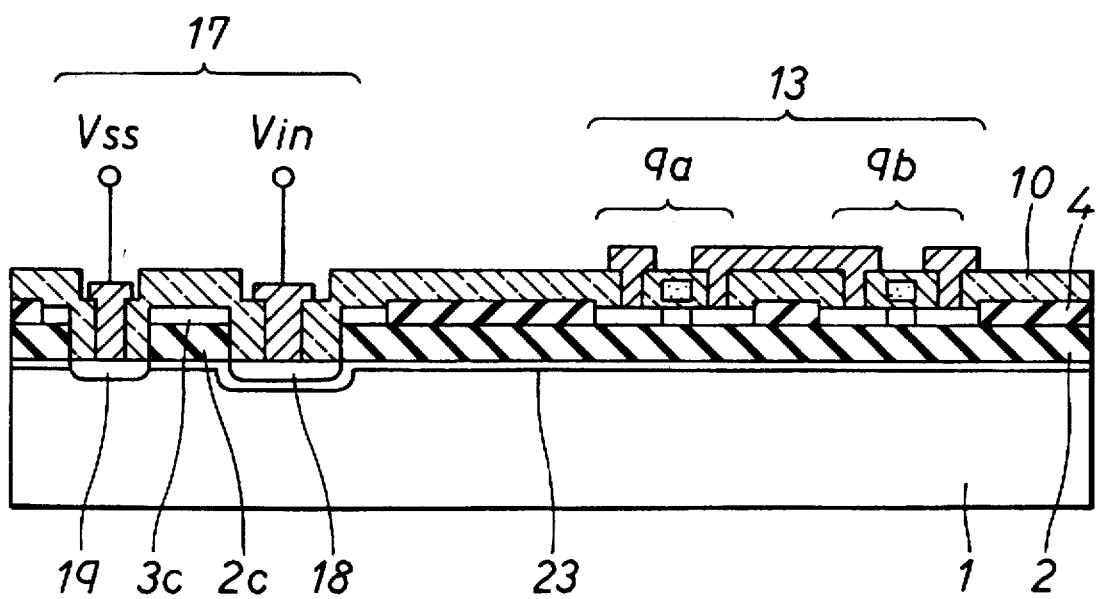
FIG. 17 is a circuit diagram showing the device shown in FIG. 16.

According to the above-mentioned structure, the depletion layer 23 as shown in FIG. 17 which is formed at the interface between the semiconductor substrate 1 around the n-type diffusion layer 18 and the buried insulating film 2 is cut off by the p-type diffusion layer 19, and therefore it is possible to suppress the leakage current between the n-type diffusion layer 18 and the p-type diffusion layer 19.

Especially, since boron which is a p-type impurity may be absorbed by heat treatment from the semiconductor substrate 1 into the buried insulating film 2 of $SiO_2$, in a case where a p-type substrate is used as the semiconductor substrate 1, the impurity concentration of the semiconductor substrate 1 in the vicinity of the interface between this substrate 1 and the buried insulating film 2 is likely to decrease. This raises the problem that the leakage current occurs. However, adopting the above-mentioned construction makes it possible to suppress the leakage current sufficiently.

Figure 2A:
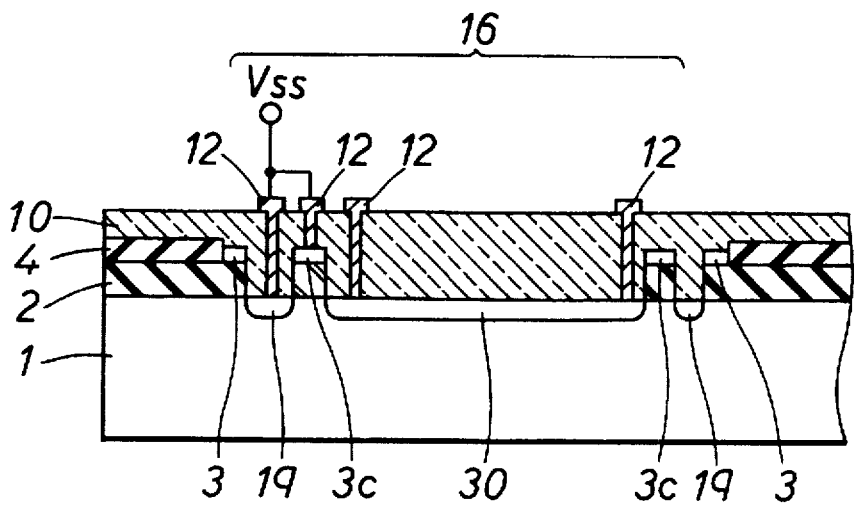
FIG. 2A is a cross-sectional view showing main components of a protective resistor portion in the first embodiment.

Next, the construction of a protective resistor 16 will be explained. FIG. 2A is a cross-sectional view showing main components of the protective resistor 16 and FIG. 2B is a plan view thereof having an electrode portion excluded therefrom.

Figure 2B:
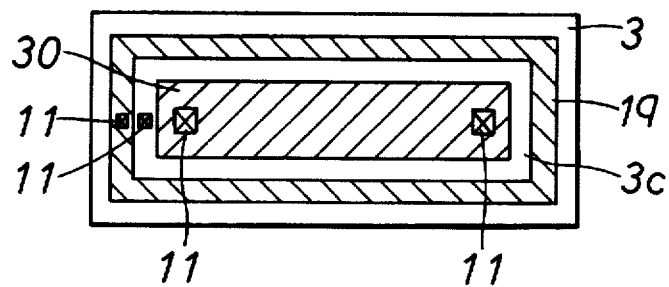
FIG. 2B is a plan view showing the protective resistor portion with its electrode portion excluded.

As shown in FIGS. 2A and 2B, the protective resistor 16 includes a second conductivity type n-type diffusion layer 30 that is formed in the semiconductor substrate 1, and is connected in series between the external input terminal 14 and the CMOS inverter circuit 13 through the intermediary of the wiring 12.

The protective resistor 16 has its periphery surrounded by the p-type diffusion layer 19 that has the same conductivity type as that of the semiconductor substrate 1.

Using the above-described construction, the depletion layer that is formed at the interface between the semiconductor substrate 1 and the buried insulating film 2 therein is cut off by the p-type diffusion layer, whereby it is possible to suppress the leakage current between the n-type diffusion layer 30 and the p-type diffusion layer 19.

Incidentally, although the gate electrode 3c need not always be provided, as shown it may be connected to the ground line Vss by way of the wiring 12.

SECOND EMBODIMENT

The first preferred embodiment described above uses the protective diode 17 in the input protection circuit 15. However, in a second preferred embodiment of the present invention, the input protection circuit uses a MOSFET 25 instead of the protective diode 17.

Figure 3A:
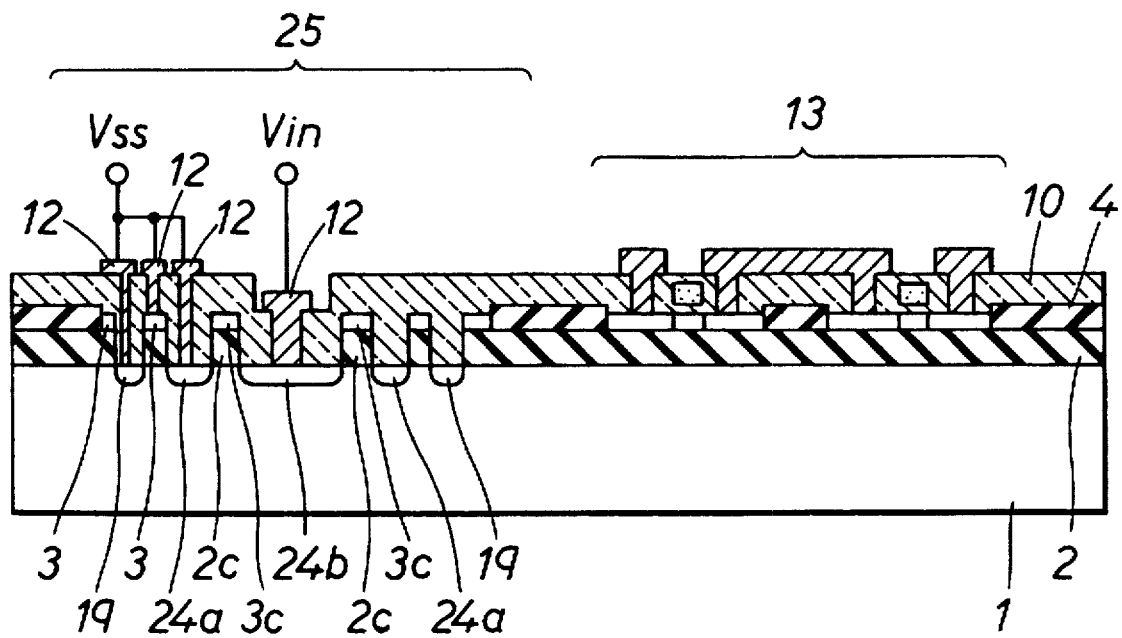
FIG. 3A is a cross-sectional view of a semiconductor integrated circuit device according to a second embodiment of the present invention.
Figures 3B, 3C:
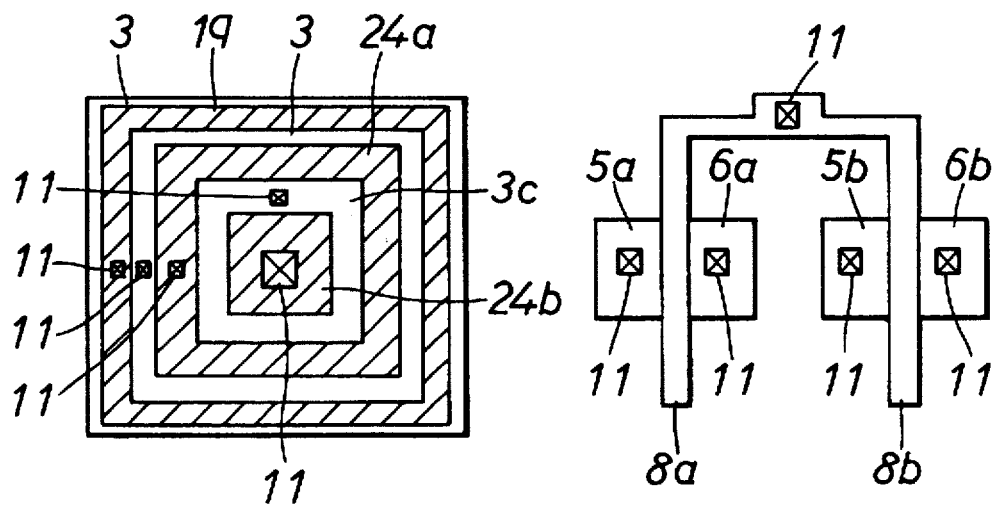
FIG. 3B is a plan view showing the semiconductor integrated circuit device according to this modification with its electrode portion excluded.
FIG. 5B is a plan view showing the semiconductor integrated circuit according to this modification with its electrode portion excluded and FIG. 3C is a plan view of the electrode.

FIG. 3A is a cross-sectional view showing a semiconductor integrated circuit device according to the second embodiment, FIG. 3B is a plan view thereof having an electrode portion excluded therefrom, and FIG. 3C is a plan view of the electrode.

The MOSFET 25 that constitutes the input protection circuit includes a source region 24a and a drain region 24b that include second conductivity type n-type diffusion layers that have been formed in the semiconductor substrate 1, gate insulation film 2c and gate electrode 3c.

The wirings 12 are connected to the source region 24a and drain region 24b through the contact holes 11 that have been formed in the inter-layer insulating film 10. Also, the semiconductor substrate 1 is connected to the ground line Vss through the p-type diffusion layer 19 by way of the wiring 12. Further, a wiring (not shown) is connected to the gate electrode 3c through the contact hole 11.

Arsenic having a concentration of, for example, $1 \times 10^{19}$ to $1 \times 10^{22}$ cm$^{-3}$ is introduced into the source region 24a and drain region 24b as the n-type impurity and boron having a concentration of, for example, $1 \times 10^{14}$ to $1 \times 10^{18}$ cm$^{-3}$ is introduced into the semiconductor substrate 1 as the p-type impurity. Also, boron having a concentration of, for example, $1 \times 10^{18}$ to $1 \times 10^{23}$ cm$^{-3}$ is introduced into the p-type diffusion layer 19 as the p-type impurity.

The drain region 24b of the MOSFET 25 is surrounded by the source region 24a through a channel formation region that is located directly below the gate electrode 2c. Further, the outer periphery of the source region 24a is surrounded by the p-type diffusion layer 19 having the same conductivity type as that of the semiconductor substrate 1.

As a result of this construction, it is possible to cut off the depletion layer formed on the surface of the semiconductor substrate 1 directly below the buried insulating film 2 on a planar basis by the source region 24a or p-type diffusion layer 19 to thereby suppress the leakage current in a parasitic diode that is formed between the drain region 24b and the semiconductor substrate 1.

Although in the above-mentioned construction the SOI layer has been used as the gate electrode 3c, when the SOI substrate is used and the buried insulating film 2 is thin, the thickness of the gate insulation film 2c becomes thin, and the threshold voltage of the MOSFET 25 decreases with the result that the "off" current increases.

Figure 4:
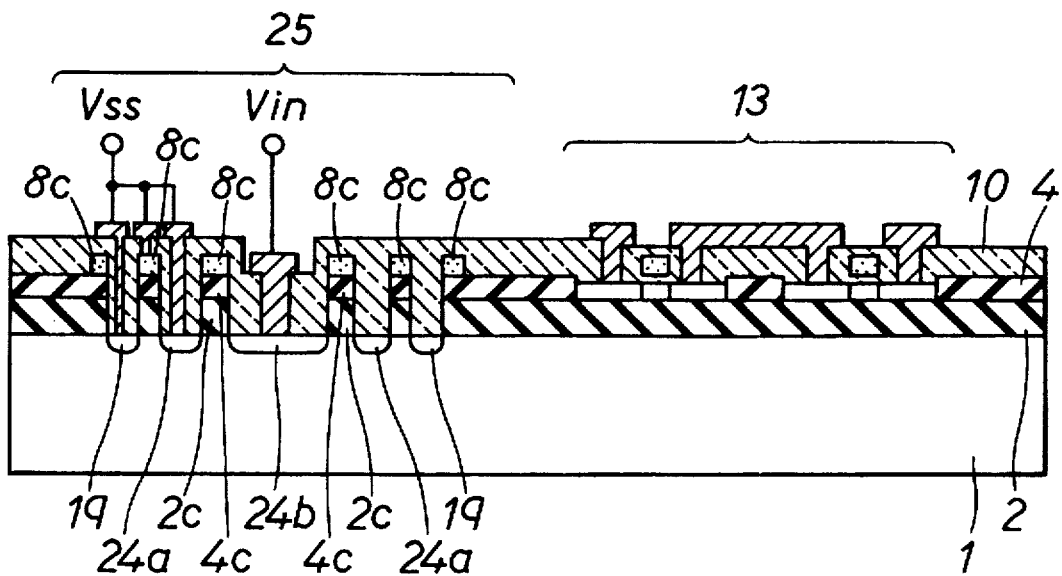
FIG. 4 is a cross-sectional view of a semiconductor integrated circuit device according to a modification of the second embodiment.

As a countermeasure against this, the structure shown in FIG. 4 may be adopted, where the same polysilicon as the gate electrodes 8a and 8b of the MOSFETs 9a and 9b is used in the gate electrode 8c of the MOSFET 25 constituting the protective circuit element. Since it is possible to use a laminated film of the element isolation insulating film 4c and the buried insulating film 2c instead of only the buried insulating film 2c alone, the gate insulation film can be thicker than the case where the SOI layer is used as the gate electrode. In this way, it is possible to prevent the decrease in the threshold value voltage.

Figure 5A:
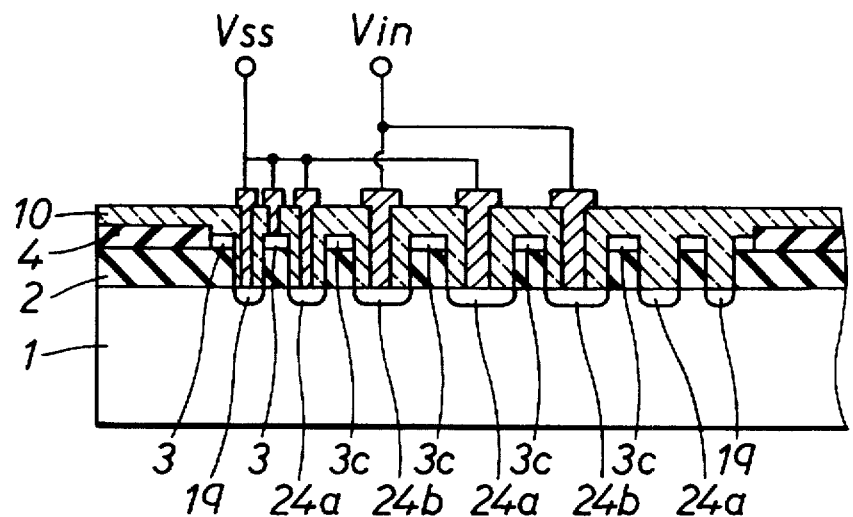
FIG. 5A is a cross-sectional view showing main components of a semiconductor integrated circuit device according to another modification of the second embodiment.
Figure 5B:
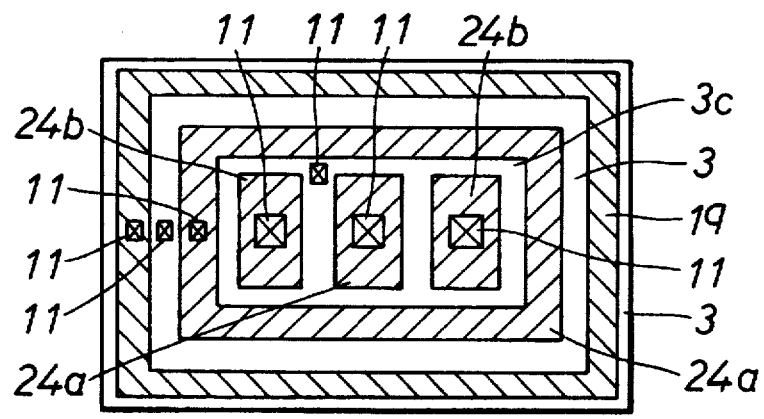

Also, as shown in FIG. 5, a plurality of source regions and a plurality of drain regions of the MOSFET 25 may be alternately disposed, provided, however, that in this case the drain region 24b also has its outer periphery surrounded by the source region 24a through the channel formation region located directly below the gate electrode 3c.

According to this layout, it is possible to effectively ensure a significant increase in the width of the channel region between the source region and the drain region, and in this way a large amount of current can flow therethrough. Accordingly, the resulting MOSFET 25 is effective when used as a protective transistor.

Incidentally, in the MOSFETs shown in FIGS. 3–5, the gate electrode 3c is connected to Vss or Vin according to the necessity.

Also, it is sufficient that each of the MOSFETs shown in FIGS. 3–5 be arranged to have only a structure wherein the source region 24a surrounds the outer periphery of the drain region 24b in the plan layout, and the p-type diffusion layer 19 can be disposed to surround the periphery of the MOSFET. Also, the SOI layer 3 need not always be connected to the ground line Vss.

THIRD EMBODIMENT

Figure 6:
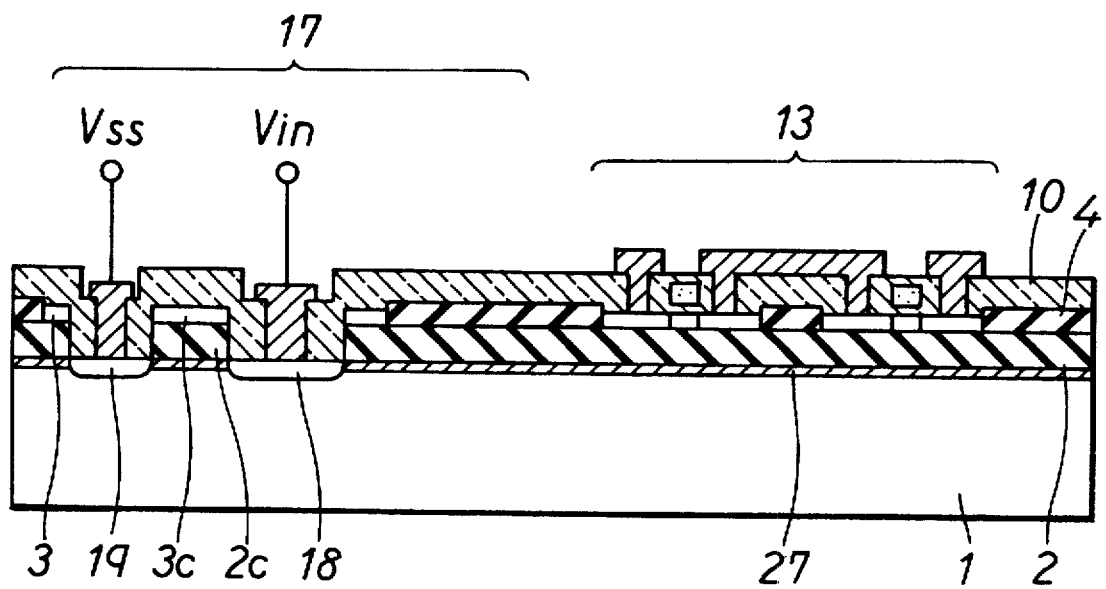
FIGS. 6–8 are cross-sectional view of semiconductor integrated circuit devices according to third through fifth preferred embodiments, respectively, of the present invention.

FIG. 6 is a structural view showing a main section of a semiconductor integrated circuit device according to a third preferred embodiment of the present invention.

In this embodiment, a p-type diffusion layer 27 that has the same conductivity type as that of the semiconductor substrate 1 is formed over almost the entire surface of the semiconductor substrate 1 directly below the buried insulating film 2 formed therein, and the protective diode 17 which is composed of the second conductivity type n-type diffusion layer 18, first conductivity type p-type diffusion layer 19, gate insulation film 2c and gate electrode 3c is formed in a region having the p-type diffusion layer 27.

Arsenic having a concentration of, for example, $1 \times 10^{17}$ to $1 \times 10^{23}$ cm$^{-3}$ is introduced into the n-type diffusion layer 18 as the n-type impurity, boron having a concentration of, for example, $1 \times 10^{14}$ to $1 \times 10^{17}$ cm$^{-3}$ is introduced into the semiconductor substrate 1 as the p-type impurity, and boron having a concentration of, for example, $1 \times 10^{18}$ to $1 \times 10^{23}$ cm$^{-3}$ is introduced into the p-type diffusion layer 19 as the p-type impurity.

Boron, for example, is introduced the p-type diffusion layer 27 as the p-type impurity at a concentration that is higher than that of the semiconductor substrate 1. Preferably, this concentration is, for example, $1 \times 10^{15}$ to $1 \times 10^{18}$ cm$^{-3}$.

By forming the p-type diffusion layer 27 having a concentration that is higher than that of the semiconductor substrate 1 in the semiconductor substrate 1 as mentioned above, it is possible to prevent the depletion layer from being formed at the interface between the semiconductor substrate 1 and the buried insulating film 2 and thereby suppress the occurrence of the leakage current between the n-type diffusion layer 18 and p-type diffusion layer 19 in the protective diode 17.

FOURTH EMBODIMENT

In contrast to the arrangement shown in the third preferred embodiment, a fourth preferred embodiment of the present invention uses a MOSFET instead of a diode as in the case of the second preferred embodiment.

Figure 7:
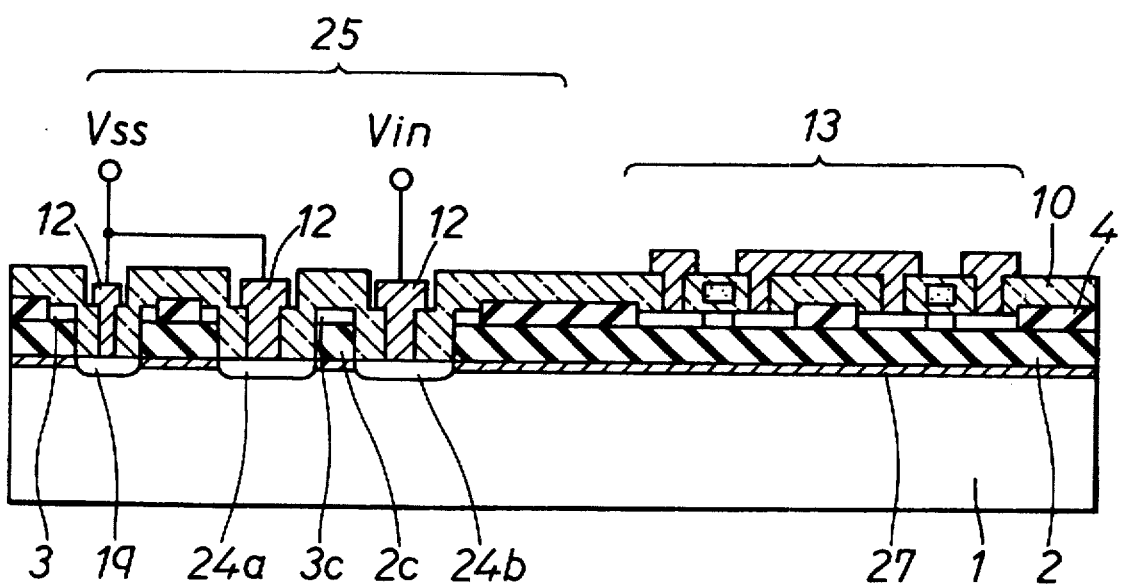

This arrangement is shown in FIG. 7. In this embodiment, the respective concentrations of the source region 24a, drain region 24b, semiconductor substrate 1 and p-type diffusion layer 19 are the same as in the case of the second embodiment and the concentration of the p-type diffusion layer 27 is higher than that of the semiconductor substrate 1 as in the case of the third embodiment.

Accordingly, it is possible to prevent the depletion layer from being formed at the interface between the semiconductor substrate 1 and the buried insulating film 2 and it is thereby possible to suppress the leakage current between the drain region 24b and the p-type diffusion layer 19 in the protective transistor 25.

In each of the above-mentioned first to fourth embodiments, in order to decrease the leakage current in the element formed in the semiconductor substrate, the diffusion layer is surrounded by another diffusion layer or a diffusion layer that has the same conductivity type as that of the semiconductor substrate is formed directly below the buried insulating film. Each of these embodiments can be manufactured by a process similar to ones used to make the prior art device shown in FIG. 17, with only the mask pattern for the formation of a relevant semiconductor element being changed.

FIFTH EMBODIMENT

Figure 8:
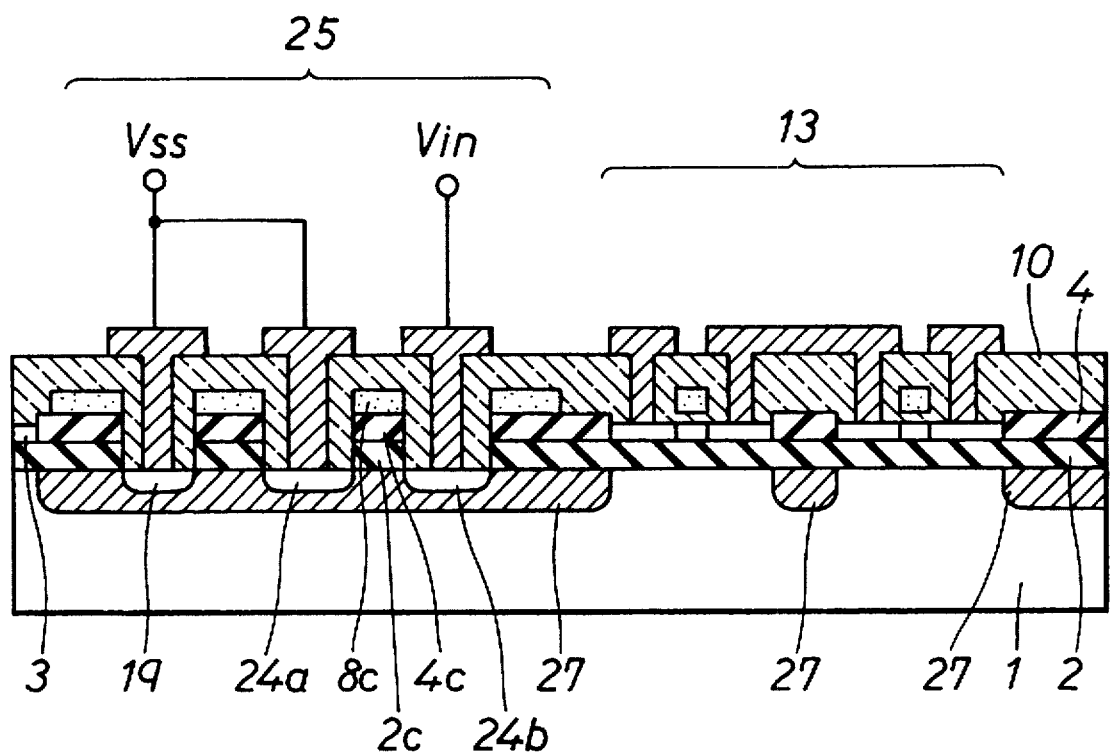

Although in the third and fourth embodiments the p-type diffusion layer 27 having the same conductivity type as that of the semiconductor substrate 1 is disposed over substantially the entire surface of the semiconductor substrate 1 directly below the buried insulating film 2 formed therein, it is also possible to suppress the leakage current by forming the p-type diffusion layer 27 selectively in only the portions of the semiconductor substrate 1 that exclude the region thereof directly below the SOI layer for the formation of the nMOS 9a and pMOS 9b. FIG. 8 shows a main cross-sectional structure of this fifth embodiment.

The MOSFET 25 which serves as a protective transistor is includes the source region 24a and drain region 24b formed in the semiconductor substrate 1, gate insulation films 2c and 4c and gate electrode 8c.

The gate insulation film 2c is part of the buried insulating film 2, the insulating film 4c is part of the element separation insulating film 4, and the gate electrode 8c is part of the gate electrodes 8a and 8b.

Arsenic having a concentration of, for example, $1\times10^{19}$ to $1\times10^{23}$ cm$^{-3}$ is introduced into each of the n-type diffusion layers 24a and 24b as the n-type impurity, boron that has a concentration of, for example, $1\times10^{14}$ to $1\times10^{17}$ cm$^{-3}$ is introduced into the semiconductor substrate 1 as the p-type impurity, and boron that has a concentration of, for example, $1\times10^{18}$ to $1\times10^{23}$ cm$^{-3}$ is introduced into the p-type diffusion layer 19 as the p-type impurity.

The MOSFET 25 is surrounded by the p-type diffusion layer 27 that has the same conductivity type as that of the semiconductor substrate 1. Boron, for example, is introduced as the p-type impurity into this p-type diffusion layer 27 at a concentration that is higher than that of the semiconductor substrate 1. Preferably, this concentration is, for example, $1\times10^{15}$ to $1\times10^{18}$ cm$^{-3}$.

The p-type diffusion layer 19 may be located outside the p-type diffusion layer 27. Also, in the MOSFET 25, it is sufficient that the polysilicon layer 8c be formed in a region used as the gate electrode, i.e., in at least a region between the source and drain regions.

Next, the process for manufacturing a semiconductor integrated circuit device according to this fifth embodiment will be explained.

Figure 9:
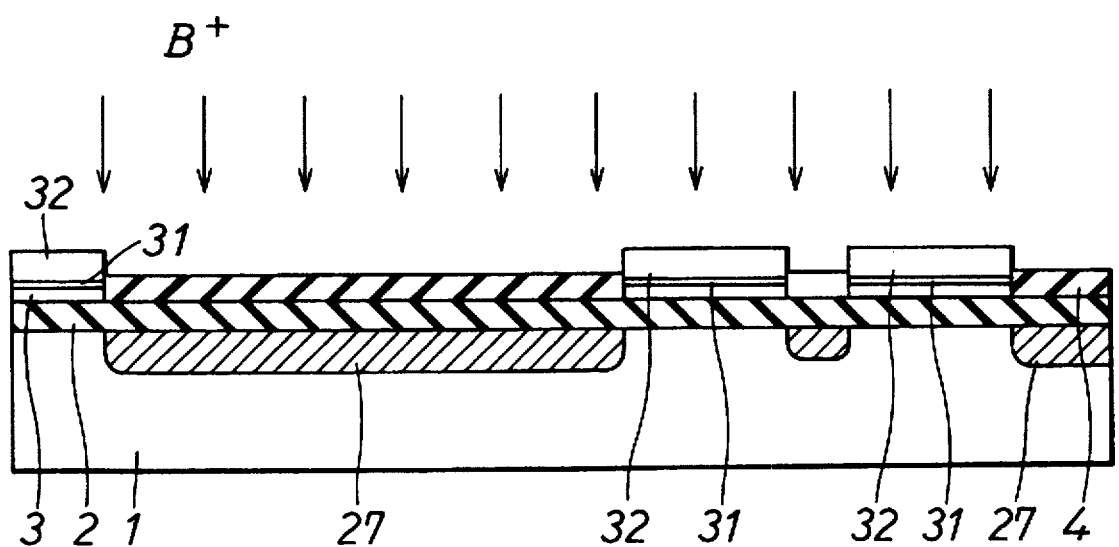
FIG. 9 is a step view showing an initial step of a process for manufacturing a semiconductor integrated circuit device according to the fifth embodiment.

First, as shown in FIG. 9, using, for example, a SIMOX technique, a SOI substrate that is composed of a semiconductor substrate 1 including p-type monocrystalline silicon, a buried insulating film 2 including SiO$_2$ and a SOI layer 3 including a monocrystalline silicon layer is prepared. Further, an oxide film 31 is formed on the SOI layer 3, and a nitride film 32 is deposited thereon and patterning is performed by photolithography. Thereafter, the SOI layer 3 is separated into islanded portions by an ordinary LOCOS separation technique.

Next, using the nitride film 32 as a mask and using, for example, boron (B+) as the p-type ion having the same first conductivity type as that of the semiconductor substrate 1, this boron is ion-implanted into the semiconductor substrate 1 through the element separation insulating film 4 and the buried insulating film 2.

Figure 10:
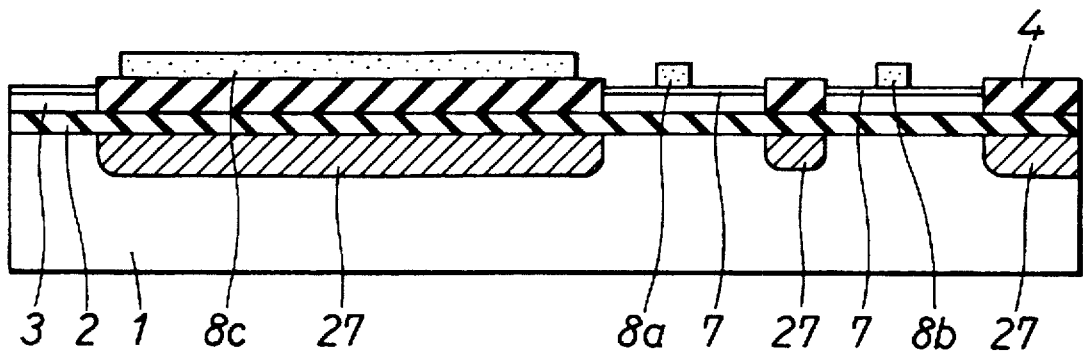
FIGS. 10–14 show progressive steps in the manufacturing process.

Next, after removal of the nitride film, temporary oxidation and removal for removing damage are performed. Then, as shown in FIG. 10, the gate insulation film 7 is formed on the surface of the SOI layer 3 by thermal oxidation, and a polysilicon film is deposited over the entire surface of the resulting structure using a CVD technique. Then, patterning is performed with respect thereto by photolithography to thereby form the gate electrodes 8a, 8b and 8c.

Thereafter, if necessary, an impurity for the formation of a low-concentration diffusion layer (not shown) that serves as an electric-field mitigation layer is ion-implanted into each of the regions for the formation of the nMOS 9a and pMOS 9b, after which an SiO$_2$ film is deposited over the entire surface of the resulting structure using a CVD technique. Then, by anisotropic etching, a side wall insulation film (not shown) is formed with respect to each side of the gate electrode.

Figure 11:
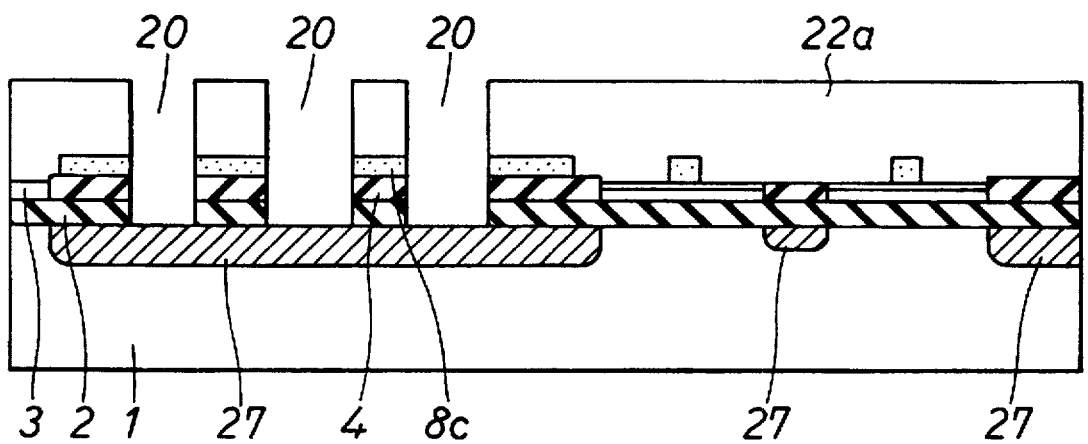

Next, as shown in FIG. 11, a photoresist 22a is patterned using photolithography. Then, using this photoresist 22a as a mask, the polysilicon 8c, element separation insulating film 4 and buried insulating film 2 are dry etched. Due to this dry etching, the windows (substrate contact holes) 20 which reach the semiconductor substrate 1 are formed to thereby expose the surface of the semiconductor substrate 1.

The ion implantation step for the formation of the above-mentioned low-concentration diffusion layer and the step for the formation of the above-mentioned side wall insulation film may be performed after the formation of the substrate contact holes 20. In this case, the low-concentration diffusion layer is also formed in the semiconductor substrate 1 and further, the side wall insulation film is also formed on the side wall of each substrate contact hole 20.

Figure 12:
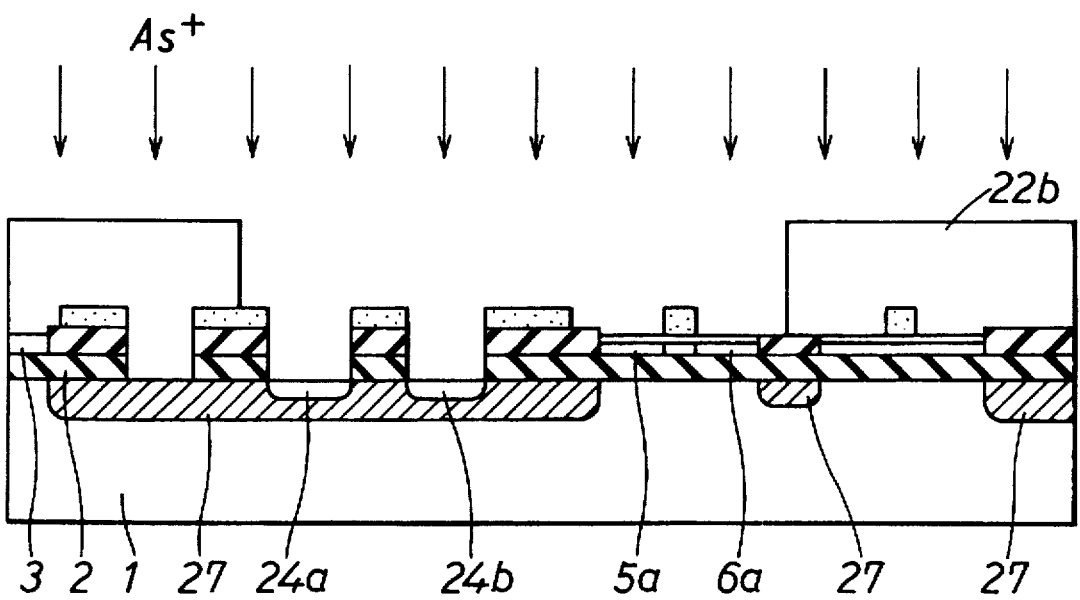

Next, if necessary, after an oxide film (not shown) having a thickness of approximately 20 nm has been formed on the exposed silicon surface by thermal oxidation, as shown in FIG. 12, a photoresist 22b is patterned and, using this as a mask, ion implantation using arsenic (As+) which is an n-type impurity is performed to form the source region 5a and drain region 6a of the nMOS 9a and the source region 24a and drain region 24b of the MOSFET 25.

Figure 13:
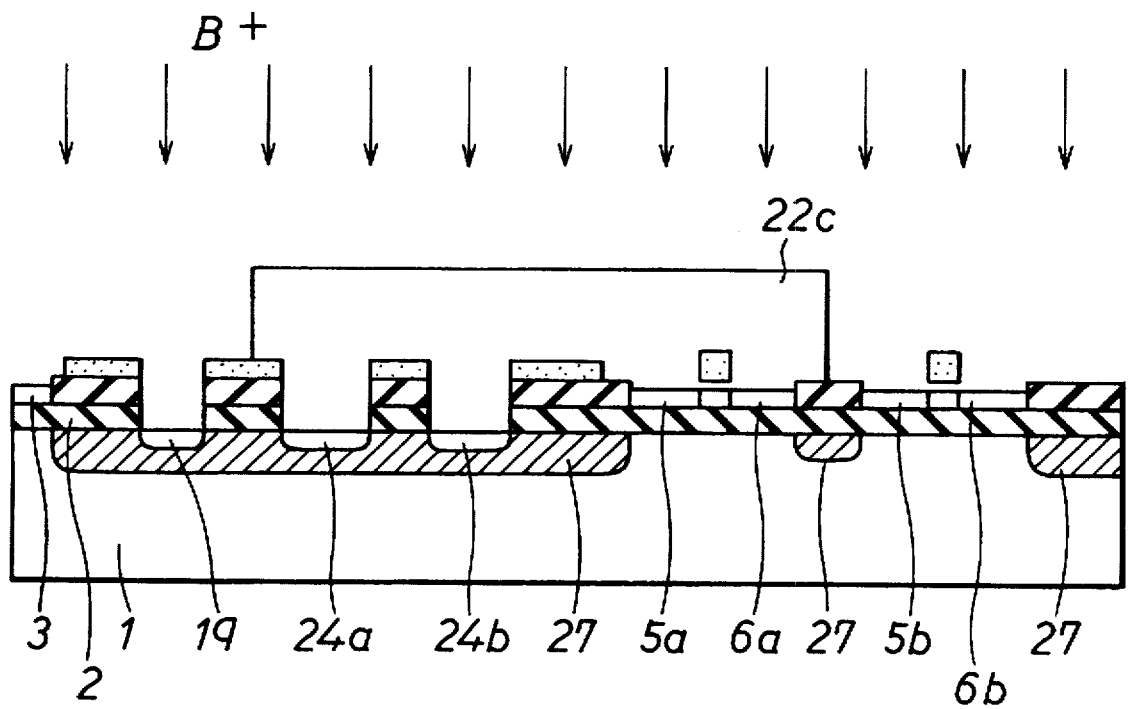

Further, after removal of the photoresist 22b, as shown in FIG. 13, in the same manner as in the case of the nMOS, using a photoresist 22c as a mask, boron (B+) which is a p-type impurity is ion-implanted into the source region 5b and drain region 6b of the pMOS 9b as well as into the p-type diffusion layer 19 that serves as a substrate connection diffusion layer.

Figure 14:
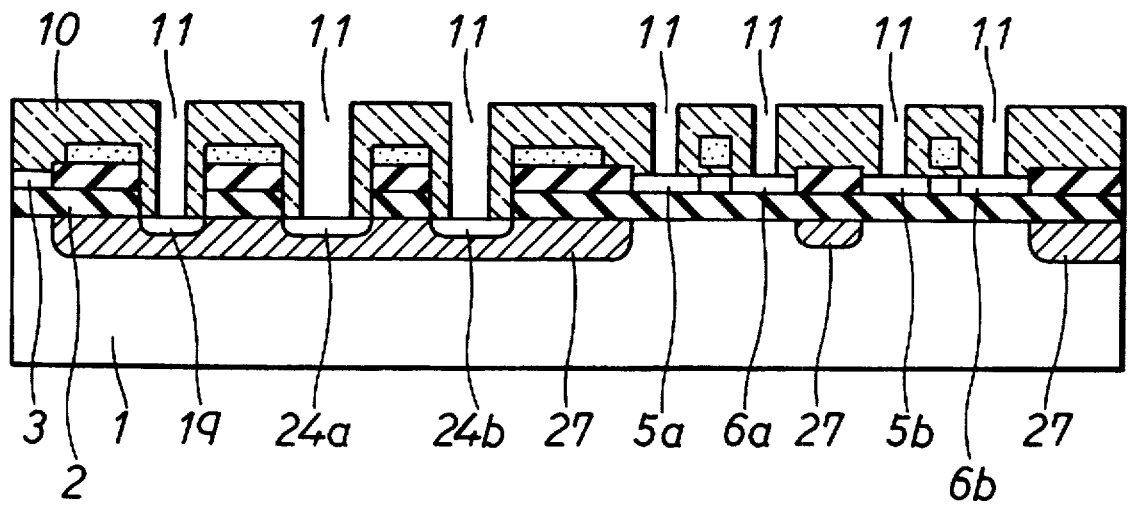
Figure 15:
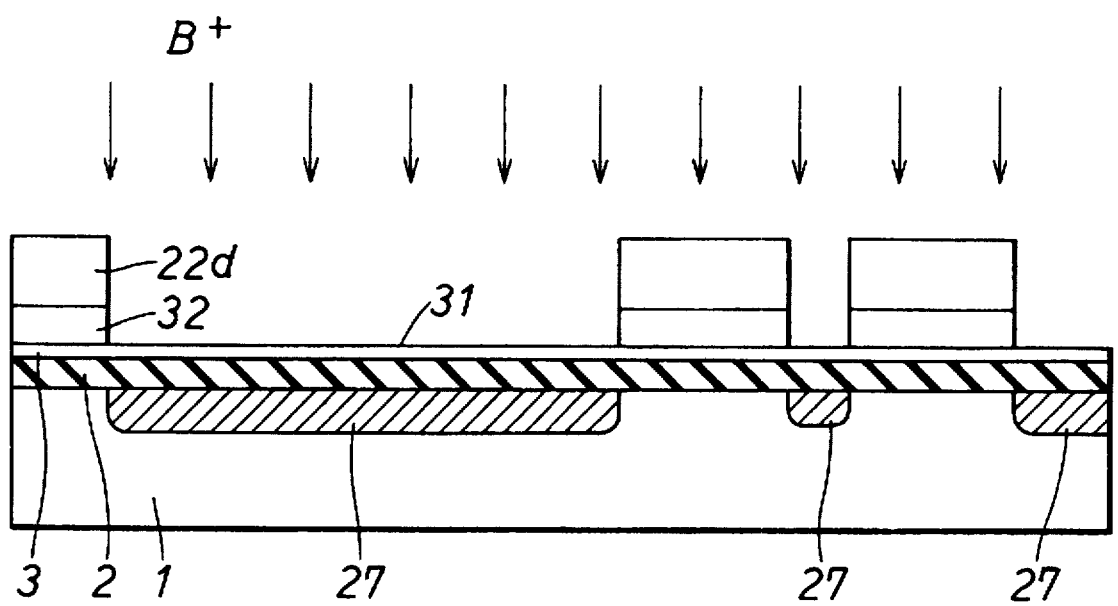
FIG. 15 shows a modification of the step shown in FIG. 9.

Next, as shown in FIG. 14, after a BPSG film is deposited as the inter-layer insulating film 10 over the entire surface of the resulting structure using a CVD technique, reflow heat treatment is performed to activate the ion implanted impurity and thereby form the diffusion layer, after which the contact holes 11 are formed using a photolithography technique.

Thereafter, an Al alloy film is deposited over the entire surface of the resulting structure by sputtering, and patterning is performed using photolithography so that the wirings 12 are formed to obtain the structure shown in FIG. 8.

According to the above-mentioned manufacturing process, it is possible to form the p-type diffusion layer 27 selectively in only the portion of the semiconductor substrate 1 that excludes the region thereof directly below the SOI layer where the nMOS 9a and pMOS 9b are to be formed. Also, no direct ion implantation is performed with respect to the SOI layer for the formation of the nMOS 9a and pMOS 9b. Accordingly, it is possible to form the p-type diffusion layer 27 in the MOSFET 25 formation region without damaging the SOI layer by ion implantation and thus suppress the leakage current that flows through the interface between the interior of the semiconductor substrate 1 and the buried insulating film 2.

In the step shown in FIG. 9, ion implantation may be performed after the patterning of the nitride film, namely before the LOCOS oxidation. In this case, boron (B+) ions are implanted into the semiconductor substrate 1 through the oxide film 31, SOI layer 3 and buried insulating layer 2. As a result, the region where ions are implanted becomes thin compared to the case where ions are implanted after LOCOS oxidation.

Also, although the above-mentioned embodiments use the p-type semiconductor substrate, the use of an n-type semiconductor substrate also makes it possible to make similar constructions by merely changing the conductivity type of the diffusion layer.

Further, the present invention can be applied not only to the case where the protective circuit element of the semiconductor integrated circuit device having a SOI structure is formed in the semiconductor substrate but also to the case where another semiconductor circuit element having a pn junction is formed in the semiconductor substrate.

Although the present invention has been fully described in connection with the preferred embodiment thereof with reference to the accompanying drawings, it is to be noted that various changes and modifications will become apparent to those skilled in the art. Such changes and modifications are to be understood as being included within the scope of the present invention as defined by the appended claims.

What is claimed is:

1. A semiconductor integrated circuit device comprising:
a first conductivity type semiconductor substrate;
an insulating layer formed on the semiconductor substrate;
a semiconductor layer formed on the insulating layer;
a first semiconductor circuit element formed on the semiconductor layer; and
a second semiconductor circuit element formed within the semiconductor substrate to have a second conductivity type first diffusion layer, the first diffusion layer being formed at the surface of the semiconductor substrate where the semiconductor substrate faces the insulating layer;
wherein the second conductivity type first diffusion layer has its periphery surrounded completely on a planar basis by a first conductivity type second diffusion layer whose concentration is higher than that of the semiconductor substrate, the second diffusion layer being formed at the surface of the semiconductor substrate where the semiconductor substrate faces the insulating layer.

2. The semiconductor integrated circuit device of claim 1, wherein the second semiconductor circuit element is a protective circuit element that protects the first semiconductor circuit element.

3. The semiconductor integrated circuit device of claim 2, wherein the second semiconductor circuit element is a diode that is includes a pn junction formed by the semiconductor substrate and the first diffusion layer.

4. The semiconductor integrated circuit device of claim 2, wherein the second semiconductor circuit element is a MOSFET whose source region and drain region are constituted by the first diffusion layer.

5. The semiconductor integrated circuit device of claim 2, wherein the second semiconductor circuit element is a diffusion resistor in which the first diffusion layer is used as a resistance.

6. The semiconductor integrated circuit device of claim 1, wherein the second semiconductor circuit element is a diode that includes a pn junction formed by the semiconductor substrate and the first diffusion layer.

7. The semiconductor integrated circuit device of claim 1, wherein the second semiconductor circuit element is a MOSFET whose source region and drain region are constituted by the first diffusion layer.

8. The semiconductor integrated circuit device of claim 1, wherein the second semiconductor circuit element is a diffusion resistor in which the first diffusion layer is used as a resistance.

9. A semiconductor integrated circuit device comprising:
a first conductivity type semiconductor substrate;
an insulator layer formed on the semiconductor substrate;
a semiconductor layer formed on the insulator layer;
a first semiconductor circuit element formed on the semiconductor layer; and
a MOSFET that serves as a second semiconductor circuit element having a source region and drain region formed within the semiconductor substrate;
wherein both the source region and the drain region are formed at the surface of the semiconductor substrate where the semiconductor substrate faces the insulating layer; and
the drain region has its periphery surrounded by the source region on a planar basis.

10. The semiconductor integrated circuit device of claim 9, wherein the MOSFET is a protective circuit element that protects the first semiconductor circuit element.

11. The semiconductor integrated circuit device of claim 10, wherein the MOSFET has a plurality of drain regions that are isolated from each other on a planar basis.

12. The semiconductor integrated circuit device of claim 11, wherein the source region has its periphery surrounded on a planar basis by a first conductivity type diffusion layer whose concentration is higher than that of the semiconductor substrate.

13. The semiconductor integrated circuit device of claim 10, wherein the source region has its periphery surrounded on a planar basis by a first conductivity type diffusion layer whose concentration is higher than that of the semiconductor substrate.

14. The semiconductor integrated circuit device of claim 9, wherein the MOSFET has a plurality of drain regions that are isolated from each other on a planar basis.

15. The semiconductor integrated circuit device of claim 14, wherein the source region has its periphery surrounded on a planar basis by a first conductivity type diffusion layer whose concentration is higher than that of the semiconductor substrate.

16. The semiconductor integrated circuit device of claim 9, wherein the source region has its periphery surrounded on a planar basis by a first conductivity type diffusion layer whose concentration is higher than that of the semiconductor substrate.

17. A semiconductor integrated circuit device comprising:
a first conductivity type semiconductor substrate;
an insulator layer formed on the semiconductor substrate;
a semiconductor layer formed on the insulator layer;
a plurality of first MOSFETs each having a source region and drain region formed in the semiconductor layer, a first gate insulation film and a first gate electrode; and
a second MOSFET that has a source region and drain region formed within the semiconductor substrate, a second gate insulation film and a second gate electrode;
wherein both the source region and the drain region of the second MOSFET are formed at the surface of the semiconductor substrate where the semiconductor substrate faces the insulating layer; and
in the second MOSFET the second gate electrode includes the same layer as that which constitutes the first gate electrodes and further the drain region has its periphery surrounded by the source region on a planar basis.

18. The semiconductor integrated circuit device of claim 17, wherein the second MOSFET is a protective circuit element for protecting the first MOSFETs.

19. A semiconductor integrated circuit device comprising:
a first conductivity type semiconductor substrate;
a semiconductor layer formed on the semiconductor substrate through an insulator layer;
a first semiconductor circuit element formed on the semiconductor layer; and
a second semiconductor circuit element formed within the semiconductor substrate to have a second conductivity type first diffusion layer;
wherein the second semiconductor circuit element is formed within a first conductivity type second diffusion layer region that has been formed within the semiconductor substrate that is located directly below the insulator layer.

20. The semiconductor integrated circuit device of claim 19, wherein the second diffusion layer is formed over an entire surface of the semiconductor substrate.

21. The semiconductor integrated circuit device of claim 20, wherein the second semiconductor circuit element is a protective circuit element that protects the first semiconductor circuit element.

22. The semiconductor integrated circuit device of claim 19, wherein the second diffusion layer is formed within a portion of the semiconductor substrate that excludes a region thereof located directly below the first semiconductor circuit element.

23. The semiconductor integrated circuit device of claim 22, wherein the second semiconductor circuit element is a protective circuit element that protects the first semiconductor circuit element.

24. The semiconductor integrated circuit device of claim 19, wherein the second semiconductor circuit element is a protective circuit element that protects the first semiconductor circuit element.

* * * * *